(12) United States Patent
Pu et al.

(10) Patent No.: US 12,041,812 B2
(45) Date of Patent: Jul. 16, 2024

(54) DISPLAY PANEL AND METHOD OF MANUFACTURING THE SAME, AND DISPLAY DEVICE

(71) Applicant: BOE Technology Group Co., Ltd., Beijing (CN)

(72) Inventors: Chao Pu, Beijing (CN); Shengji Yang, Beijing (CN); Pengcheng Lu, Beijing (CN); Kuanta Huang, Beijing (CN); Xiaochuan Chen, Beijing (CN); Junbo Wei, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 491 days.

(21) Appl. No.: 17/437,460

(22) PCT Filed: Dec. 4, 2020

(86) PCT No.: PCT/CN2020/133923
§ 371 (c)(1),
(2) Date: Sep. 9, 2021

(87) PCT Pub. No.: WO2022/116158
PCT Pub. Date: Jun. 9, 2022

(65) Prior Publication Data
US 2022/0209178 A1 Jun. 30, 2022

(51) Int. Cl.
*H10K 50/844* (2023.01)
*H10K 50/842* (2023.01)
(Continued)

(52) U.S. Cl.
CPC .......... *H10K 50/844* (2023.02); *H10K 59/38* (2023.02); *H10K 71/00* (2023.02);
(Continued)

(58) Field of Classification Search
None
See application file for complete search history.

(56) References Cited

U.S. PATENT DOCUMENTS

| 8,836,337 | B2 | 9/2014 | Qiu et al. |
| 9,601,721 | B2 | 3/2017 | Lang et al. |

(Continued)

FOREIGN PATENT DOCUMENTS

| CN | 101800238 A | 8/2010 |
| CN | 102645788 A | 8/2012 |

(Continued)

*Primary Examiner* — Michael Lebentritt
(74) *Attorney, Agent, or Firm* — Westman, Champlin & Koehler, P.A.

(57) ABSTRACT

A display panel, a method of manufacturing a display panel, and a display device are provided. The display panel includes: a substrate; a light-emitting device layer arranged on the substrate; a first thin film encapsulation layer including at least one organic layer; a color filter layer; a second thin film encapsulation layer including at least one organic layer; and an adhesive film layer arranged on at least one side of the color filter layer, wherein the adhesive film layer is in direct contact with the color filter layer, and the adhesive film layer and the color filter layer are stacked, and a material of the adhesive film layer has a viscosity greater than a viscosity of a material of the organic layer in each of the first thin film encapsulation layer and the second thin film encapsulation layer.

20 Claims, 10 Drawing Sheets

(51) Int. Cl.
     *H10K 59/38*     (2023.01)
     *H10K 71/00*     (2023.01)
     *H10K 59/12*     (2023.01)
     *H10K 59/124*     (2023.01)

(52) U.S. Cl.
     CPC ..... *H10K 50/8426* (2023.02); *H10K 59/1201* (2023.02); *H10K 59/124* (2023.02)

(56) References Cited

U.S. PATENT DOCUMENTS

| | | |
|---|---|---|
| 10,818,876 B2 | 10/2020 | Huang |
| 2012/0092017 A1 | 4/2012 | Qiu et al. |
| 2014/0246665 A1 | 9/2014 | Lang et al. |
| 2018/0212167 A1* | 7/2018 | Chun ................... H10K 50/841 |
| 2020/0168842 A1 | 5/2020 | Huang |
| 2022/0376213 A1* | 11/2022 | Ma ........................ H10K 50/865 |
| 2022/0406858 A1* | 12/2022 | Zhao ..................... H10K 59/65 |
| 2023/0006178 A1* | 1/2023 | Liu ....................... H10K 50/844 |

FOREIGN PATENT DOCUMENTS

| | | |
|---|---|---|
| CN | 103531609 A | 1/2014 |
| CN | 103956435 A | 7/2014 |
| CN | 104701349 A | 6/2015 |
| CN | 107359271 A | 11/2017 |
| CN | 107833977 A | 3/2018 |
| CN | 108630732 A | 10/2018 |
| CN | 210723099 U | 6/2020 |
| KR | 20160029179 A | 3/2016 |
| WO | 2013053805 A1 | 4/2013 |
| WO | WO-2023159498 A1 * | 8/2023 |

* cited by examiner

DISPLAY PANEL AND METHOD OF MANUFACTURING THE SAME, AND DISPLAY DEVICE

CROSS REFERENCE TO RELATED APPLICATION(S)

This application is a Section 371 National Stage Application of International Application No. PCT/CN2020/133923, filed on Dec. 4, 2020, entitled "DISPLAY PANEL AND METHOD OF MANUFACTURING THE SAME, AND DISPLAY DEVICE", the contents of which are incorporated herein by reference in their entireties.

TECHNICAL FIELD

The present disclosure relates to a field of display technology, and in particular to a display panel, a method of manufacturing the display panel, and a display device.

BACKGROUND

Compared with conventional AMOLED display technology, silicon-based OLED micro-display based on monocrystalline silicon and by means of mature CMOS technology may have a smaller pixel size and a higher integration. It may be made into a near-eye display product comparable to a large-screen display and has received wide attention. Based on the technological advantages and broad market, the silicon-based OLED micro-display will set off a new wave of near-eye displays in fields of military and consumer electronics, and may bring users an unprecedented visual experience.

SUMMARY

Some embodiments of the present disclosure provide a display panel, including: a substrate; a light-emitting device layer arranged on the substrate; a first thin film encapsulation layer arranged on a side of the light-emitting device layer away from the substrate, wherein the first thin film encapsulation layer includes at least one organic layer; a color filter layer arranged on a side of the first thin film encapsulation layer away from the substrate; a second thin film encapsulation layer arranged on a side of the color filter layer away from the substrate, wherein the second thin film encapsulation layer includes at least one organic layer; an adhesive film layer arranged on at least one side of the color filter layer, wherein the adhesive film layer is in direct contact with the color filter layer, and the adhesive film layer and the color filter layer are stacked, and a material of the adhesive film layer has a viscosity greater than a viscosity of a material of the organic layer in each of the first thin film encapsulation layer and the second thin film encapsulation layer.

In some embodiments, the adhesive film layer is in direct contact with the organic layer in at least one of the first thin film encapsulation layer and the second thin film encapsulation layer.

In some embodiments, the adhesive film layer includes: a first adhesive film layer arranged between the first thin film encapsulation layer and the color filter layer; and a second adhesive film layer arranged between the color filter layer and the second thin film encapsulation layer.

In some embodiments, an orthographic projection of the color filter layer on the substrate falls within at least one of an orthographic projection of the first adhesive film layer on the substrate and an orthographic projection of the second adhesive film layer on the substrate.

In some embodiments, an orthographic projection of the color filter layer on the substrate falls within an orthographic projection of the first thin film encapsulation layer on the substrate; the orthographic projection of the first thin film encapsulation layer on the substrate falls within an orthographic projection of the first adhesive film layer on the substrate; the orthographic projection of the first adhesive film layer on the substrate falls within an orthographic projection of the second adhesive film layer on the substrate; and the orthographic projection of the second adhesive film layer on the substrate falls within an orthographic projection of the second thin film encapsulation layer on the substrate.

In some embodiments, an area of the orthographic projection of the color filter layer on the substrate, an area of the orthographic projection of the first thin film encapsulation layer on the substrate, an area of the orthographic projection of the first adhesive film layer on the substrate, an area of the orthographic projection of the second adhesive film layer on the substrate and an area of the orthographic projection of the second thin film encapsulation layer on the substrate increases in sequence.

In some embodiments, the display panel includes a display area and a peripheral area surrounding the display area, the orthographic projection of the color filter layer on the substrate falls within the display area, and each of an edge of the first thin film encapsulation layer, an edge of the first adhesive film layer, an edge of the second adhesive film layer and an edge of the second thin film encapsulation layer is located in the peripheral area.

In some embodiments, in a direction from the display area to the peripheral area, the edge of the first thin film encapsulation layer, the edge of the first adhesive film layer, the edge of the second adhesive film layer and the edge of the second thin film encapsulation layer are arranged sequentially away from the display area, and are spaced apart from each other.

In some embodiments, a distance between the edge of the first thin film encapsulation layer and the edge of the first adhesive film layer is greater than four times a dimension of a pixel unit of the display panel; a distance between the edge of the first adhesive film layer and the edge of the second adhesive film layer is greater than four times the dimension of the pixel unit of the display panel; and a distance between the edge of the second adhesive film layer and the edge of the second thin film encapsulation layer is greater than four times the dimension of the pixel unit of the display panel.

In some embodiments, the adhesive film layer includes an organic material including at least one of 1-methoxy-2-propanol, propylene glycol monomethyl ether ester, multi-functional group of acrylic monomers, oxime derivative and acrylic resin derivative.

In some embodiments, a thickness of the first adhesive film layer is less than a thickness of the second adhesive film layer.

In some embodiments, the thickness of the second adhesive film layer is about 3 times that of the first adhesive film layer.

In some embodiments, the first thin film encapsulation layer includes a first sub-layer, a second sub-layer and a third sub-layer that are arranged sequentially away from the substrate and that are stacked, the first sub-layer includes silicon nitride, the second sub-layer includes aluminum oxide, the third sub-layer includes parylene, and the first adhesive film layer is in direct contact with the third sub-layer.

In some embodiments, the thickness of the first adhesive film layer is greater than half of a thickness of the third sub-layer.

In some embodiments, the second thin film encapsulation layer includes a fourth sub-layer and a fifth sub-layer that are arranged sequentially away from the substrate and that are stacked, the fourth sub-layer includes parylene, the fifth sub-layer includes silicon oxide, and the second adhesive film layer is in direct contact with the fourth sub-layer.

In some embodiments, the light-emitting device layer includes a plurality of light-emitting devices arranged in an array, and each of the plurality of light-emitting devices includes a first electrode, a light-emitting functional portion and a second electrode that are arranged sequentially away from the substrate, wherein for any two adjacent light-emitting devices among the plurality of light-emitting devices, the first electrode of one of the any two adjacent light-emitting devices is spaced apart from the first electrode of another of the any two adjacent light-emitting devices, light-emitting functional portions of the any two adjacent light-emitting devices are formed as an integral structure, and second electrodes of the any two adjacent light-emitting devices are formed as an integral structure, and wherein the color filter layer includes a plurality of color filters corresponding to the plurality of light-emitting devices one-to-one, and an orthographic projection of the first electrode of each of the plurality of light-emitting devices on the substrate falls within an orthographic projection of the color filter corresponding to the each of the plurality of light-emitting devices on the substrate.

In some embodiments, the plurality of light-emitting devices includes a first light-emitting device and a second light-emitting device that are adjacent to each other, and a gap is formed between the first electrode of the first light-emitting device and the first electrode of the second light-emitting device; the color filter layer includes a first color filter and a second color filter, and the first color filter has a color different from a color of the second color filter, the first color filter corresponds to the first light-emitting device, the second color filter corresponds to the second light-emitting device, and the first color filter and the second color filter have an overlapping portion; an orthographic projection of the gap on the substrate falls within an orthographic projection of the overlapping portion on the substrate.

In some embodiments, the gap is filled with an integral structure including a light-emitting functional portion of the first light-emitting device and a light-emitting functional portion of the second light-emitting device.

In some embodiments, the substrate is a silicon substrate, and the display panel is a silicon-based display panel.

Some embodiments of the present disclosure provide a display device, including the display panel described in the above embodiments.

Some embodiments of the present disclosure provide a method of manufacturing a display panel, including: forming a light-emitting device layer on a substrate; forming a first thin film encapsulation layer on a side of the light-emitting device layer away from the substrate, wherein the first thin film encapsulation layer includes at least one organic layer; forming a color filter layer on a side of the first thin film encapsulation layer away from the substrate; forming a second thin film encapsulation layer on a side of the color filter layer away from the substrate, wherein the second thin film encapsulation layer includes at least one organic layer; forming an adhesive film layer on at least one side of the color filter layer, wherein the adhesive film layer is in direct contact with the color filter layer, and the adhesive film layer and the color filter layer are stacked, and a viscosity of a material of the adhesive film layer is greater than a viscosity of a material of the organic layer in each of the first thin film encapsulation layer and the second thin film encapsulation layer.

BRIEF DESCRIPTION OF THE DRAWINGS

By reading the detailed description of the non-limiting embodiments with reference to the following drawings, other features, objectives and advantages of the present disclosure will become more apparent.

DETAILED DESCRIPTION OF EMBODIMENTS

Figure 1:
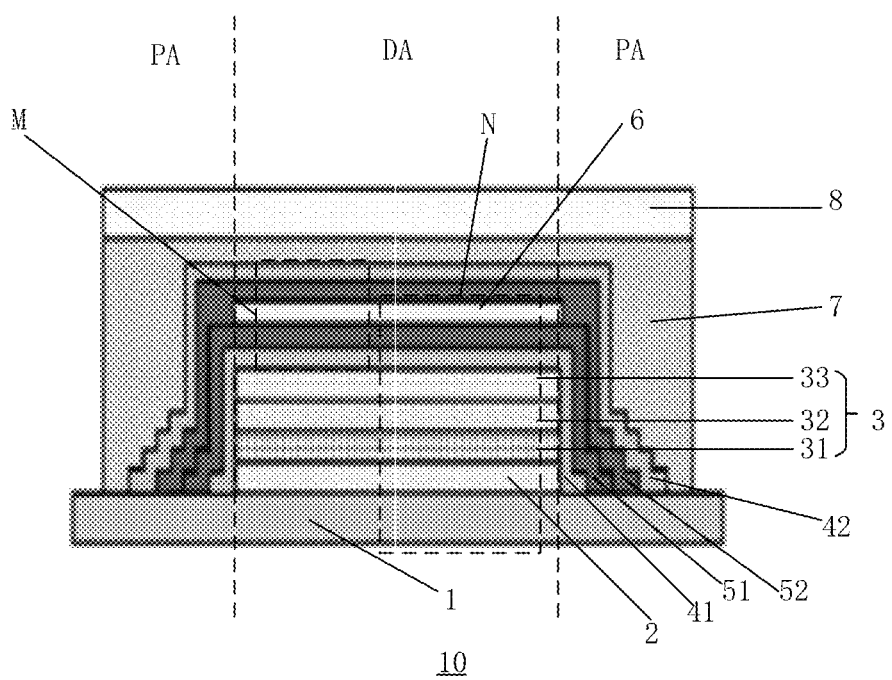
FIG. 1 shows a schematic cross-sectional view of a display panel according to some embodiments of the present disclosure.

The present disclosure will be further described in detail below with reference to the drawings and embodiments. It may be understood that the specific embodiments described here are only used to explain the related invention, but not to limit the present disclosure. In addition, it should be noted that, for ease of description, only the parts related to the present disclosure are shown in the drawings.

It should be noted that, in a case of no conflict, the embodiments in the present disclosure and the features in the embodiments may be combined with each other.

In addition, in the following detailed description, for the convenience of explanation, many specific details are set forth to provide a comprehensive understanding of the embodiments of the present disclosure. Obviously, however, one or more embodiments may also be implemented without these specific details.

It should be understood that, although terms "first," "second" and so on may be used herein to describe different elements, these elements should not be limited by these terms. These terms are only used to distinguish one element from another element. For example, without departing from the scope of the exemplary embodiments, a first element may be named as a second element, and similarly, the second element may be named as the first element. A term "and/or" as used here includes any and all combinations of one or more related listed items.

It should be understood that when an element or layer is referred to as being "formed on" another element or layer, the element or layer may be directly or indirectly formed on the another element or layer. That is, for example, an intermediate element or an intermediate layer may be present. In contrast, when an element or layer is referred to as being "directly formed on" another element or layer, no intermediate elements or layers are present. Other terms used to describe a relationship between elements or layers (for example, "between" and "directly between", "adjacent to" and "directly adjacent to", etc.) should be interpreted in a similar manner.

The terms used herein are only for the purpose of describing specific embodiments, and are not intended to limit the embodiments. As used herein, unless otherwise specified in the context, a singular form is also intended to include a plural form. It should also be understood that when terms "comprising" and/or "including" are used herein, it means that the described features, wholes, steps, operations, elements and/or components are present, but do not exclude the presence or addition of one or more other features, wholes, steps, operations, elements, components and/or combinations thereof.

In the present disclosure, unless otherwise specified, expressions "located in the same layer" and "arranged in the same layer" generally mean that a first component and a second component may be formed of the same material and may be formed by the same patterning process. The expressions "located in different layers" and "arranged in different layers" generally indicate that the first component and the second component are formed by different patterning processes.

In a related art, a full color of a silicon-based OLED display panel is generally implemented by using white light OLED (WOLED)+color filter (also known as CF) technology. Specifically, after a light-emitting device layer including a plurality of OLEDs arranged in an array is formed on a silicon substrate, the light-emitting device layer is thin-film encapsulated. For example, a first thin film encapsulation layer for covering the light-emitting device layer may be formed on a side of the light-emitting device layer away from the silicon substrate. Then a color filter layer is formed on the first thin film encapsulation layer to realize a color display of the silicon-based OLED display panel. Subsequently, the silicon-based OLED display panel formed with the color filter layer is further thin-film encapsulated. For example, a second thin film encapsulation layer for covering the color filter layer may be formed on a side of the color filter layer away from the silicon substrate. The first thin film encapsulation layer and the second thin film encapsulation layer are generally implemented by a stacked structure of an inorganic layer, an organic layer, and an inorganic layer.

The inventor found that the silicon-based OLED display panel in the related art has following problems. The first thin film encapsulation layer and the second thin film encapsulation layer in the related art are both in direct contact with the color filter layer and only play a role of sealing. Water and oxygen may be separated out from impurity particles located on upper and lower surfaces of the color filter layer introduced during the manufacturing process, which may cause the color filter layer to be corroded by the internal water and oxygen, so that a poor display may be caused. In addition, each sub-layer of the first thin film encapsulation layer and the second thin film encapsulation layer in contact with the color filter layer is an inorganic layer, and a stress at an interface between the inorganic layer and the color filter layer is large, which makes the thin film encapsulation layer easily pierced by the impurity particles on the surfaces of the color filter layer, resulting in the color filter layer being corroded by external water and oxygen.

In order to solve the problem that the color filter of the silicon-based OLED is corroded by water and oxygen in the related art, the present disclosure provides a display panel, including: a substrate; a light-emitting device layer arranged on the substrate; a first thin film encapsulation layer arranged on a side of the light-emitting device layer away from the substrate, in which the first thin film encapsulation layer includes at least one organic layer; a color filter layer arranged on a side of the first thin film encapsulation layer away from the substrate; a second thin film encapsulation layer arranged on a side of the color filter layer away from the substrate, in which the second thin film encapsulation layer includes at least one organic layer; an adhesive film layer arranged on at least one side of the color filter layer, in which the adhesive film layer and the color filter layer are in direct contact with each other and are stacked, and a material of the adhesive film layer has a viscosity greater than that of a material of the organic layer in the first thin film encapsulation layer and that of a material of the organic layer in the second thin film encapsulation layer.

In some embodiments, the adhesive film layer includes: a first adhesive film layer arranged between the first thin film encapsulation layer and the color filter layer; and a second adhesive film layer arranged between the color filter layer and the second thin film encapsulation layer.

In the embodiments of the present disclosure, the adhesive film layer is provided between the color filter layer and the thin film encapsulation layer (the first thin film encapsulation layer and/or the second thin film encapsulation layer), which increases an adhesion between the color filter layer and the thin film encapsulation layer, so that the thin film encapsulation layer has stronger encapsulation performance. In addition, the adhesive film layer is arranged immediately adjacent to the color filter, so that the impurity particles on the upper and lower sides of the color filter introduced during the manufacturing process enter the adhesive film layer and are completely enclosed by the adhesive film layer. On the one hand, water and oxygen cannot be separated out through these impurity particles, thereby avoiding the color filter being corroded by internal water and oxygen. On the other hand, the adhesive film layer is arranged between the color filter and the thin film encapsulation layer and has a predetermined thickness to prevent the thin film encapsulation layer from being punctured by impurity particles, thereby protecting the color filter layer from corrosion of external water and oxygen.

A silicon-based OLED display panel is illustrated by way of example in describing the following embodiments of the present disclosure. Those skilled in the art may understand that the solutions of the present disclosure may also be applied to other display panels, such as a glass-based OLED.

FIG. 1 shows a schematic cross-sectional view of a display panel according to some embodiments of the present disclosure. As shown in FIG. 1, a display panel 10 includes a substrate 1, and a driving circuit layer 2 and a light-emitting device layer 3 provided on the substrate 1. The substrate 1 is, for example, a silicon substrate, which is made of monocrystalline silicon. The light-emitting device layer 3 is arranged on a side of the driving circuit layer 2 away from the substrate 1. The light-emitting device layer 3 includes a first electrode layer 31, a light-emitting functional layer 32 and a second electrode layer 33 that are arranged sequentially away from the substrate 1. The first electrode layer 31 is, for example, an anode layer, the second electrode layer 33 is, for example, a cathode layer, and the light-emitting functional layer 32 includes, for example, a hole injection layer, a hole transport layer, a light-emitting layer, an electron transport layer and an electron injection layer that are arranged sequentially away from the substrate 1. In some embodiments, the light-emitting device layer 3 may include a plurality of light-emitting devices arranged in an array, for example, OLEDs, and the display is realized by controlling light emission of the plurality of light-emitting devices.

As shown in FIG. 1, the display panel 10 may further include a first thin film encapsulation layer 41 that covers the light-emitting device layer 3 and the driving circuit layer 2. Specifically, the first thin film encapsulation layer 41 may cover a side of the light-emitting device layer 3 away from the substrate 1, and cover a sidewall of the light-emitting device layer 3 and a sidewall of the driving circuit layer 2. An orthographic projection of the light-emitting device layer 3 on the substrate 1 and an orthographic projection of the driving circuit layer 2 on the substrate 1 fall within an orthographic projection of the first thin film encapsulation layer 41 on the substrate 1. The first thin film encapsulation layer 41 functions to seal the light-emitting device layer 3 and the driving circuit layer 2 so as to prevent water and oxygen from corroding the light-emitting device layer 3 and the driving circuit layer 2.

As shown in FIG. 1, the display panel 10 may further include a first adhesive film layer 51 that covers the first thin film encapsulation layer 41. Specifically, the first adhesive film layer 51 may cover a side of the first thin film encapsulation layer 41 away from the substrate 1 and cover a sidewall of the first thin film encapsulation layer 41. An orthographic projection of the first thin film encapsulation layer 41 on the substrate 1 falls within an orthographic projection of the first adhesive film layer 51 on the substrate 1.

In some embodiments, the first adhesive film layer 51 is, for example, an organic adhesive, which may be specifically one or more of 1-methoxy-2-propanol, propylene glycol monomethyl ether ester, multifunctional group of acrylic monomers, oxime derivative, and acrylic resin derivative. With such a design, the first adhesive film layer 51 is in direct contact with a color filter layer 6 to be formed later. The impurity particles on a lower surface of the color filter layer 6 (that is, a surface facing the substrate 1) may be immersed into the first adhesive film layer 51 and completely enclosed by the first adhesive film layer 51, so as to prevent water and oxygen from being separated out through the impurity particles and corroding the color filter layer 6.

In some embodiments, the first adhesive film layer 51 may have a thickness of, for example, 1000 angstroms to 3000 angstroms, so that the impurity particles mentioned above may be completely enclosed in the first adhesive film layer 51 to avoid piercing the first thin film encapsulation layer 41, thereby ensuring an encapsulation effect.

As shown in FIG. 1, the display panel 10 may further include a color filter layer 6 arranged on a side of the first adhesive film layer 51 away from the substrate 1. The color filter layer 6 may include, for example, a plurality of color filters respectively corresponding to the plurality of light-emitting devices in the light-emitting device layer 3. The plurality of light-emitting devices in the light-emitting device layer 3 may be, for example, white light OLEDs. When white light emitted by the white light OLED passes through the corresponding color filter, only a specific color of light is allowed to pass, thereby realizing a full-color display of the display panel. An orthographic projection of the color filter layer 6 on the substrate 1 substantially coincides with an orthographic projection of the light-emitting device layer 3 on the substrate 1. In some embodiments, a thickness of the color filter layer 6 may be with a range of 9000 angstroms to 11000 angstroms.

As shown in FIG. 1, the display panel 10 may further include a second adhesive film layer 52 that covers the color filter layer 6 and the first adhesive film layer 51. Specifically, the second adhesive film layer 52 covers a side of the color filter layer 6 away from the substrate 1 and a sidewall of the color filter layer 6, and further covers a part of the first adhesive film layer 51 that is not covered by the color filter layer. An orthographic projection of the color filter layer 6 on the substrate 1 and an orthographic projection of the first adhesive film layer 51 on the substrate 1 falls within an orthographic projection of the second adhesive film layer 52 on the substrate 1.

In some embodiments, the second adhesive film layer 52 is, for example, an organic adhesive, which may be specifically one or more of 1-methoxy-2-propanol, propylene glycol monomethyl ether ester, multifunctional group of acrylic monomers, oxime derivative, and acrylic resin derivative. With such a design, the second adhesive film layer 52 is in direct contact with the color filter layer 6. The impurity particles on an upper surface of the color filter layer 6 (that is, a surface away from the substrate 1) may be immersed into the second adhesive film layer 52 and completely enclosed by the second adhesive film layer 52, so as to prevent water and oxygen from being separated out through the impurity particles and corroding the color filter layer 6.

In some embodiments, the second adhesive film layer 52 may have a thickness of, for example, 3000 angstroms to 5000 angstroms, so that the impurity particles mentioned above may be completely enclosed in the second adhesive film layer 52 to avoid piercing the second thin film encapsulation layer 42 to be formed later, thereby ensuring the encapsulation effect.

As shown in FIG. 1, the display panel 10 may further include a second thin film encapsulation layer 42 that covers the second adhesive film layer 52. Specifically, the second thin film encapsulation layer 42 may cover a side of the second adhesive film layer 52 away from the substrate 1 and cover a sidewall of the second adhesive film layer 52. An orthographic projection of the second adhesive film layer 52 on the substrate 1 falls within an orthographic projection of the second thin film encapsulation layer 42 on the substrate 1.

As shown in FIG. 1, the display panel 10 may further include a cover plate 8 made of a transparent material. The cover plate 8 may be, for example, a glass cover plate. The cover plate 8 is bonded, through a sealant 7, to the substrate 1 formed with the second thin film encapsulation layer 42. The sealant 7 and the cover plate 8 provide additional multiple safeguards for preventing the intrusion of external water and oxygen.

In the embodiments of the present disclosure, the adhesive film layer (the first adhesive film layer and/or the second adhesive film layer) is provided between the color filter layer and the thin film encapsulation layer (the first thin film encapsulation layer and/or the second thin film encapsulation layer), which increases an adhesion between the color filter layer and the thin film encapsulation layer, so that the thin film encapsulation layer has stronger encapsulation performance. In addition, the adhesive film layer is arranged immediately adjacent to the color filter, so that the impurity particles on the upper and lower sides of the color filter introduced during the manufacturing process enter the adhesive film layer and are completely enclosed by the adhesive film layer. On the one hand, water and oxygen may not be separated out through these impurity particles, thereby avoiding the color filter being corroded by internal water and oxygen. On the other hand, the adhesive film layer is arranged between the color filter and the thin film encapsulation layer and has a predetermined thickness to prevent the thin film encapsulation layer from being punctured by the impurity particles, thereby protecting the color filter layer from corrosion of external water and oxygen and ensuring a service life of the display panel.

Figure 2:
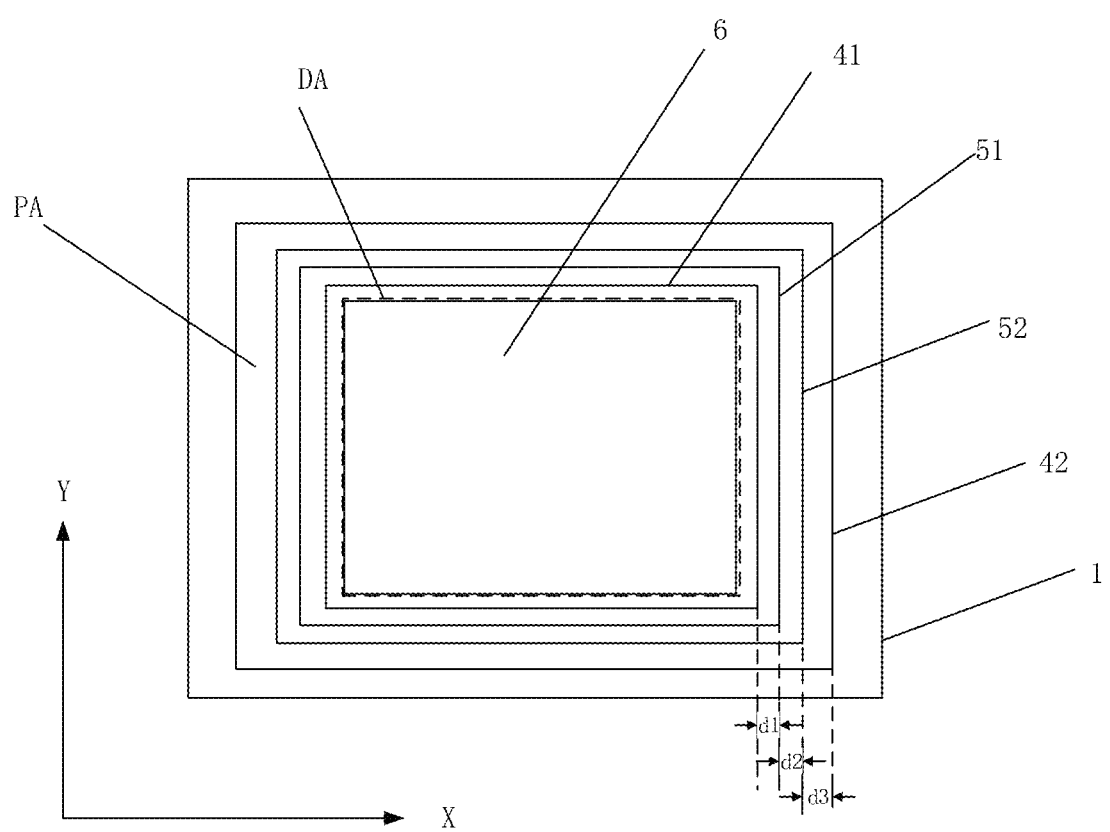
FIG. 2 shows a schematic plan view of a display panel according to some embodiments of the present disclosure, in which only a substrate, a first thin film encapsulation layer, a first adhesive film layer, a color filter layer, a second adhesive film layer, and a second thin film encapsulation layer are shown.

FIG. 2 shows a schematic plan view of a display panel according to some embodiments of the present disclosure, in which only the substrate, the first thin film encapsulation layer, the first adhesive film layer, the color filter layer, the second adhesive film layer and the second thin film encapsulation layer are shown to reflect a relative positional relationship of edges of the first thin film encapsulation layer, the first adhesive film layer, the color filter layer, the second adhesive film layer and the second thin film encapsulation layer.

Those skilled in the art may understand that, in order to clearly reflect the edges of the first thin film encapsulation layer, the first adhesive film layer, the color filter layer, the second adhesive film layer and the second thin film encapsulation layer, the edges of the first thin film encapsulation layer, the first adhesive film layer, the color filter layer, the second adhesive film layer and the second thin film encapsulation layer are all drawn with solid lines, which does not mean a positional relationship of the first thin film encapsulation layer, the first adhesive film layer, the color filter layer, the second adhesive film layer and the second thin film encapsulation layer in a direction perpendicular to the substrate. Specifically referring to FIG. 1, the first thin film encapsulation layer, the first adhesive film layer, the color filter layer, the second adhesive film layer and the second thin film encapsulation layer are arranged sequentially away from the substrate.

Referring to FIG. 1 and FIG. 2, the display panel 10 may include a display area DA and a peripheral area PA surrounding the display area. Each of the orthographic projection of the light-emitting device layer 3 on the substrate 1 and the orthographic projection of the color filter layer 6 on the substrate 1 fall within the display area DA. Each of the orthographic projection of the first thin film encapsulation layer 41 on the substrate 1, the orthographic projection of the first adhesive film layer 51 on the substrate 1, the orthographic projection of the second adhesive film layer 52 on the substrate 1 and the orthographic projection of the second thin film encapsulation layer 42 on the substrate 1 extends from the display area DA to the peripheral area PA. In other words, each of an orthographic projection of the edge of the first thin film encapsulation layer 41, an orthographic projection of the edge of the first adhesive film layer 51 on the substrate 1, an orthographic projection of the edge of the second adhesive film layer 52 on the substrate 1 and an orthographic projection of the edge of the second thin film encapsulation layer 42 on the substrate 1 is located in the peripheral area PA. It may be considered that each of the orthographic projection of the first thin film encapsulation layer 41 on the substrate 1, the orthographic projection of the first adhesive film layer 51 on the substrate 1, the orthographic projection of the second adhesive film layer 52 on the substrate 1 and the orthographic projection of the second thin film encapsulation layer 42 on the substrate 1 covers the display area DA and a part of the peripheral area PA.

As shown in FIG. 2, each of the orthographic projection of the first thin film encapsulation layer 41 on the substrate 1, the orthographic projection of the first adhesive film layer 51 on the substrate 1, the orthographic projection of the color filter layer 6 on the substrate 1, the orthographic projection of the second adhesive film layer 52 on the substrate 1 and the orthographic projection of the second thin film encapsulation layer 42 on the substrate 1 is a rectangle. Those skilled in the art may understand that, in other embodiments, each of the orthographic projection of the first thin film encapsulation layer 41 on the substrate 1, the orthographic projection of the first adhesive film layer 51 on the substrate 1, the orthographic projection of the color filter layer 6 on the substrate 1, the orthographic projection of the second adhesive film layer 52 on the substrate 1 and the orthographic projection of the second thin film encapsulation layer 42 on the substrate 1 may also have other shapes, such as a hexagon, a circle, and so on.

In some embodiments, as shown in FIG. 1 and FIG. 2, the orthographic projection of the color filter layer 6 on the substrate 1 falls within the orthographic projection of the first thin film encapsulation layer 41 on the substrate 1; the orthographic projection of the first thin film encapsulation layer 41 on the substrate 1 falls within the orthographic projection of the first adhesive film layer 51 on the substrate 1; the orthographic projection of the first adhesive film layer 51 on the substrate 1 falls within the orthographic projection of the second adhesive film layer 52 on the substrate 1; and the orthographic projection of the second adhesive film layer 52 on the substrate 1 falls within the orthographic projection of the second thin film encapsulation layer 42 on the substrate 1. An area of the orthographic projection of the color filter layer 6 on the substrate 1, an area of the orthographic projection of the first thin film encapsulation layer 41 on the substrate 1, an area of the orthographic projection of the first adhesive film layer 51 on the substrate 1, an area of the orthographic projection of the second adhesive film layer 52 on the substrate 1 and an area of the orthographic projection of the second thin film encapsulation layer 42 on the substrate 1 increases in sequence.

In some embodiments, in a direction from the display area DA to the peripheral area PA, the edge of the first thin film encapsulation layer 41, the edge of the first adhesive film layer 51, the edge of the second adhesive film layer 52 and the edge of the second thin film encapsulation layer 42 are arranged sequentially away from the display area and are spaced apart from each other.

Specifically, each of the orthographic projection of the first thin film encapsulation layer 41 on the substrate 1, the orthographic projection of the first adhesive film layer 51 on the substrate 1, the orthographic projection of the color filter layer 6 on the substrate 1, the orthographic projection of the second adhesive film layer 52 on the substrate 1 and the orthographic projection of the second thin film encapsulation layer 42 on the substrate 1 is a rectangle, and each of the first thin film encapsulation layer 41, the first adhesive film layer 51, the color filter layer 6, the second adhesive film layer 52 and the second thin film encapsulation layer 42 includes four edges, that is, an upper edge, a lower edge, a left edge and a right edge shown in FIG. 2, which are collectively called the edge.

For the convenience of description, the upper edge of the first thin film encapsulation layer 41, the upper edge of the first adhesive film layer 51, the upper edge of the color filter layer 6, the upper edge of the second adhesive film layer 52 and the upper edge of the second thin film encapsulation layer 42 are referred to as an upper edge group; the lower edge of the first thin film encapsulation layer 41, the lower edge of the first adhesive film layer 51, the lower edge of the color filter layer 6, the lower edge of the second adhesive film layer 52 and the lower edge of the second thin film encapsulation layer 42 are referred to as a lower edge group; the left edge of the first thin film encapsulation layer 41, the left edge of the first adhesive film layer 51, the left edge of the color filter layer 6, the left edge of the second adhesive film layer 52 and the left edge of the second thin film encapsulation layer 42 are referred to as a left edge group; and the right edge of the first thin film encapsulation layer 41, the right edge of the first adhesive film layer 51, the right edge of the color filter layer 6, the right edge of the second adhesive film layer 52 and the right edge of the second thin film encapsulation layer 42 are referred to as a right edge group.

For any of the upper edge group, the lower edge group, the left edge group and the right edge group, the edge of the first thin film encapsulation layer 41, the edge of the first adhesive film layer 51, the edge of the second adhesive film layer 52 and the edge of the second thin film encapsulation layer 42 are arranged sequentially away from the display area and are spaced apart from each other.

Taking the right edge group as an example, referring to FIG. 1 and FIG. 2, in a first direction X, the right edge of the first thin film encapsulation layer 41, the right edge of the first adhesive film layer 51, the right edge of the second adhesive film 52 and the right edge of the second thin film encapsulation layer 42 are arranged sequentially away from the display area DA and are spaced apart from each other.

Specifically, in the first direction X, a distance between the right edge of the first thin film encapsulation layer 41 and the right edge of the first adhesive film layer 51 is d1, which is referred to as a first distance d1. The first distance d1 is substantially greater than a sum of an alignment accuracy of the first thin film encapsulation layer 41 and an alignment accuracy of the first adhesive film layer 51. In some embodiments, the first thin film encapsulation layer 41 is formed by an open mask process, and the alignment accuracy of the first thin film encapsulation layer 41 refers to an alignment accuracy of a mask used for forming the first thin film encapsulation layer 41 with the substrate 10. The first adhesive film layer 51 is also formed by an open mask process, and the alignment accuracy of the first adhesive film layer 51 refers to an alignment accuracy of a mask used for forming the first adhesive film layer 51 with the substrate 10. In this way, it may be ensured that the first thin film encapsulation layer 41 is completely covered by the first adhesive film layer 51. In the actual production process, even if each of the first adhesive film layer 51 and the first thin film encapsulation layer 41 has a position deviation, the first adhesive film layer 51 will not expose the first thin film encapsulation layer 41.

A distance between the right edge of the first adhesive film layer 51 and the right edge of the second adhesive film layer 52 is d2, which is referred to as a second distance d2. The second distance d2 is substantially greater than a sum of the alignment accuracy of the first adhesive film layer 51 and an alignment accuracy of the second adhesive film layer 52. In some embodiments, the second adhesive film layer 52 is also formed by an open mask process, and the alignment accuracy of the second adhesive film layer 52 refers to an alignment accuracy of a mask used for forming the second adhesive film layer 52 with the substrate 10. In this way, it may be ensured that the first adhesive film layer 51 is completely covered by the second adhesive film layer 52. In the actual production process, even if each of the first adhesive film layer 51 and the first adhesive film layer 52 has a position deviation, the second adhesive film layer 52 will not expose the first adhesive film layer 51.

A distance between the right edge of the second adhesive film layer 52 and the right edge of the second thin film encapsulation layer 42 is d3, which is referred to as a third distance d3. The third distance d3 is substantially greater than a sum of the alignment accuracy of the second adhesive film layer 52 and an alignment accuracy of the second thin film encapsulation layer 42. In some embodiments, the second thin film encapsulation layer 42 is also formed by an open mask process, and the alignment accuracy of the second thin film encapsulation layer 42 refers to an alignment accuracy of a mask used for forming the second thin film encapsulation layer 42 with the substrate 10. In this way, it may be ensured that the second adhesive film layer 52 is completely covered by the second thin film encapsulation layer 42. In the actual production process, even if each of the second thin film encapsulation layer 42 and the second adhesive film layer 52 has a position deviation, the second thin film encapsulation layer 42 will not expose the second adhesive film layer 52.

In some embodiments, any two of the alignment accuracy of the first thin film encapsulation layer 41, the alignment accuracy of the second thin film encapsulation layer 42, the alignment accuracy of the first adhesive film layer 51 and the alignment accuracy of the second adhesive film layer 52 may be the same or different. Each of the alignment accuracy of the first thin film encapsulation layer 41, the alignment accuracy of the second thin film encapsulation layer 42, the alignment accuracy of the first adhesive film layer 51 and the alignment accuracy of the second adhesive film layer 52 may be, for example, 10 μm.

In some embodiments, a pixel unit in the display panel may have a dimension of about 4.6 μm to 5.2 μm. It may be understood that each of the first distance d1, the second distance d2 and the third distance d3 is greater than four times the dimension of the pixel unit of the panel.

Those skilled in the art may understood that, similarly, in the first direction X, the left edge of the first thin film encapsulation layer 41, the left edge of the first adhesive film layer 51, the left edge of the second adhesive film 52 and the left edge of the second thin film encapsulation layer 42 are arranged sequentially away from the display area DA and are spaced apart from each other. In a second direction Y perpendicular to the first direction X, the upper edge of the first thin film encapsulation layer 41, the upper edge of the first adhesive film layer 51, the upper edge of the second adhesive film 52 and the upper edge of the second thin film encapsulation layer 42 are arranged sequentially away from the display area DA and are spaced apart from each other. In the second direction Y, the lower edge of the first thin film encapsulation layer 41, the lower edge of the first adhesive film layer 51, the lower edge of the second adhesive film 52 and the lower edge of the second thin film encapsulation layer 42 are arranged sequentially away from the display area DA and are spaced apart from each other, which will not be repeated here.

Figure 3:
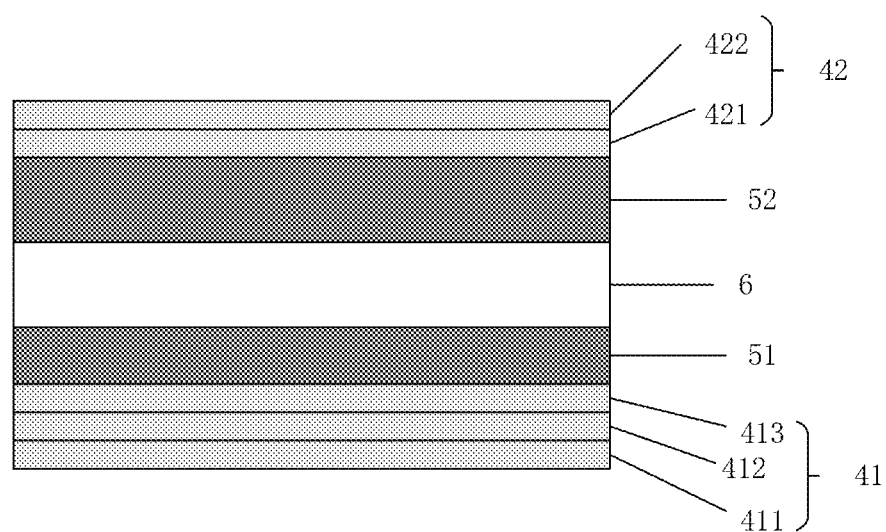
FIG. 3 shows an enlarged schematic diagram of region M in FIG. 1.

FIG. 3 shows an enlarged schematic diagram of region M in FIG. 1. In some embodiments, as shown in FIG. 1 and FIG. 3, the first thin film encapsulation layer 41 may include a first sub-layer 411, a second sub-layer 412 and a third sub-layer 413 that are arranged sequentially away from the substrate 1. The first sub-layer 411 may include, for example, silicon nitride (SiNx), and have a thickness of, for example, 2500 angstroms to 3500 angstroms. The second sub-layer 412 may include, for example, aluminum oxide ($Al_2O_3$), and have a thickness of, for example, 400 angstroms to 600 angstroms. The third organic layer 413 is in direct contact with the first adhesive film layer 51. The third sub-layer 413 may include, for example, parylene, and have a thickness of, for example, 4500 angstroms to 5500 angstroms. The third sub-layer 413 as an organic layer is bonded to the first adhesive film layer 51, so that the first thin film encapsulation layer 41 may be bonded to the first adhesive film layer 51 more tightly. A total thickness of the first thin film encapsulation layer 41 may be within a range of, for example, 7400 angstroms to 9600 angstroms.

In some embodiments, as shown in FIG. 1 and FIG. 3, the second thin film encapsulation layer 42 may include a fourth sub-layer 411 and a fifth sub-layer 422 that are arranged sequentially away from the substrate 1. The fourth sub-layer 421 may include, for example, parylene, and have a thickness of, for example, 4500 angstroms to 5500 angstroms. The fifth sub-layer 422 may include, for example, silicon oxide ($SiO_2$), and have a thickness of, for example, 950 angstroms to 1050 angstroms. The fourth organic layer 421 is in direct contact with the second adhesive film layer 52. The fourth sub-layer 421 as an organic layer is bonded to the second adhesive film layer 52, so that the second thin film encapsulation layer 42 may be bonded to the second adhesive film layer 52 more tightly. A total thickness of the second thin film encapsulation layer 42 may be within a range of, for example, 5450 angstroms to 6550 angstroms.

In some embodiments, characteristics of the adhesive film layer (such as the first adhesive film layer 51 or the second adhesive film layer 52) and the organic layer (such as the third sub-layer 413 or the fourth sub-layer 421) in the thin film encapsulation layer (such as the first thin film encapsulation layer 41 or the second thin film encapsulation layer 42) are compared as shown in Table 1:

| Film layer | Viscosity (mPa · s) | Refractive index | Density (g/cm³) | Light transmittance |
|---|---|---|---|---|
| Adhesive film layer | 1.750 | 1.4034 | 0.922 | 0.90 |
| Organic layer (Parylene) | 0.648 | 1.592 | 1.289 | 0.95 |

In some embodiments, as shown in Table 1, the adhesive film layer (such as the first adhesive film layer 51 or the second adhesive film layer 52) has a viscosity greater than that of the organic layer (such as the third sub-layer 413 or the fourth sub-layer 421) in the thin film encapsulation layer (such as the first thin film encapsulation layer 41 or the second thin film encapsulation layer 42). Due to the large viscosity, the adhesive film layer may easily adsorb impurity particles. In addition, the adhesive film layer has fluidity, and it is easy to enclose the adsorbed impurity particles therein.

In some embodiments, the adhesive film layer may have a refractive index and a density greater than those of the organic layer (Parylene), and have a light transmittance substantially the same as that of the organic layer (Parylene).

In some embodiments, the second adhesive film layer 52 may have a thickness greater than that of the first adhesive film layer 51. A thicker adhesive film layer may enclose more impurity particles. In the formation process of the display panel, the impurity particles generated during the process of forming the color filter layer 6 are obviously more than the impurity particles generated during the formation of the third sub-layer 413. In some embodiments, the color filter layer 6 may include three colors of color filters, which are formed by three film forming processes. An amount of the impurity particles generated during the process of forming the color filter layer 6 are substantially three times an amount of the impurity particles generated during the formation of the third sub-layer 413. The thickness of the second adhesive film layer 52 may be set to about three times the thickness of the first adhesive film layer 51 or more, so that the impurity particles substantially do not affect the color filter layer.

In some embodiments, in the process of forming the third sub-layer 413, the formed impurity particles generally have a dimension less than half of the thickness of the third sub-layer 413. In order that the impurity particles formed in the process are enclosed by the first adhesive film layer 51, the thickness of the first adhesive film layer 51 may be about half of the thickness of the third sub-layer 413 or more.

The foregoing embodiment gives an example in which both sides of the color filter layer are covered by the adhesive film layer. Those skilled in the art may understand that, in other embodiments, the adhesive film layer may only be provided on one side of the color filter layer. That is, the display panel only includes the first adhesive film layer or the second adhesive film layer, which may also solve the problem of the color filter layer being corroded by internal and external water and oxygen to a certain extent.

Figure 4A:
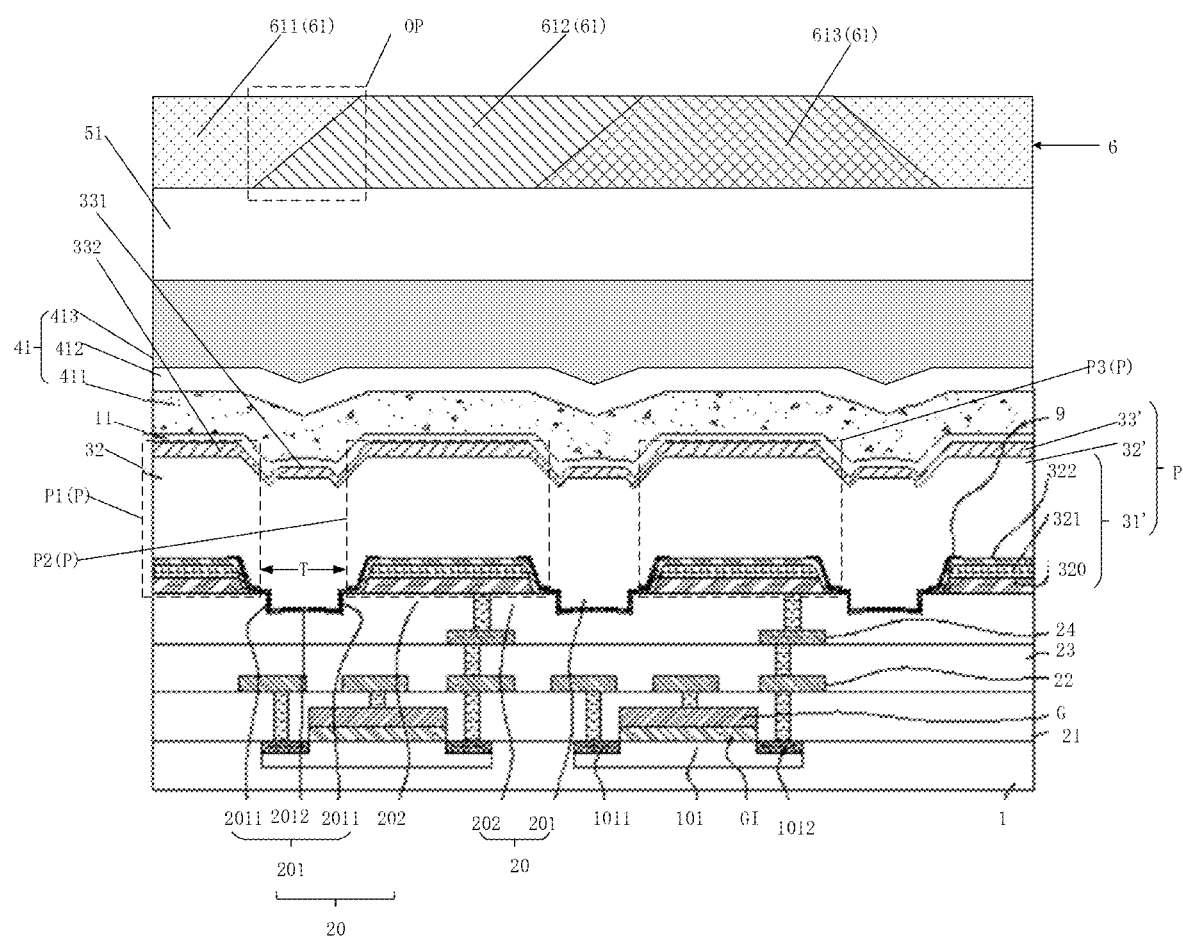
FIG. 4A shows an enlarged schematic diagram of region N in FIG. 1.
Figure 4B:
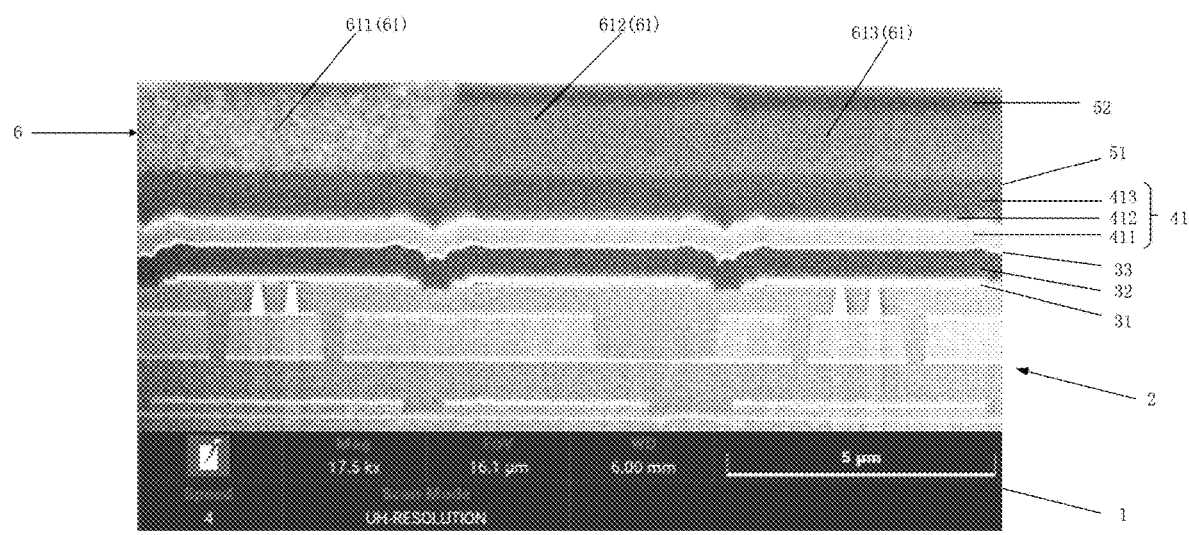
FIG. 4B shows an electron micrograph corresponding to FIG. 4A.

FIG. 4A shows an enlarged schematic diagram of region N in FIG. 1. FIG. 4B shows an electron micrograph corresponding to FIG. 4A. In some embodiments, as shown in FIG. 4A and FIG. 4B, the light-emitting device layer includes a plurality of light-emitting devices P. Each light-emitting device P includes a first electrode 31', a light-emitting functional portion 32' and a second electrode 33' that are arranged sequentially away from the substrate 1. The first electrode 31' may be, for example, an anode electrode, and the second electrode 33' may be, for example, a cathode electrode. For any two adjacent light-emitting devices P, a first electrode 31' of one of the any two adjacent light-emitting devices P is spaced apart from a first electrode 31' of another of the any two adjacent light-emitting devices P. For example, a gap T is formed between a first electrode 31' of one of two adjacent light-emitting devices P and a first electrode 31' of another of the two adjacent light-emitting devices P, so as to avoid an electrical connection between the first electrode 31' of one of the two adjacent light-emitting devices P and the first electrode 31' of another of the two adjacent light-emitting devices P. The light-emitting functional portions 32' of two adjacent light-emitting devices P are formed as an integral structure, and the second electrodes 33' of two adjacent light-emitting devices P are formed as an integral structure. The light-emitting functional portions 32' of the plurality of light-emitting devices P are connected as a whole to form the light-emitting functional layer 32 described above. The second electrodes 33' of the plurality of light-emitting devices P are connected as a whole to form the second electrode layer 33 described above.

In some embodiments, the color filter layer 6 includes a plurality of color filters 61 corresponding to the plurality of light-emitting devices P one-to-one. An orthographic projection of the first electrode 31' of each light-emitting device P on the substrate 1 falls within an orthographic projection the color filter 61 corresponding to the each light-emitting device P on the substrate.

Each light-emitting device P matches the corresponding color filter 61 to form a pixel unit. The light-emitting device P emits white light, and the white light emitted by the light-emitting device P passes through the corresponding color filter 61, and only specific color of light is allowed to pass through the corresponding color filter, so that the full-color display of the display panel is achieved.

In some embodiments, as shown in FIG. 4A and FIG. 4B, the color filter layer 6 includes a first color filter 611, a second color filter 612 and a third color filter 613 that are sequentially adjacent to each other and that respectively correspond to a first light-emitting device P1, a second light-emitting device P2 and a third light-emitting device P3 that are sequentially adjacent to each other. The first color filter 611, the second color filter 612 and the third color filter 613 have different colors. For example, the first color filter 611 is a red color filter which only allows red light to pass through, the second color filter 612 is a green color filter which only allows green light to pass through, and the third color filter 613 is a blue color filter which only allows blue light to pass through. The first color filter 611 and the corresponding first light-emitting device P1 form a first pixel unit, the second color filter 612 and the corresponding second light-emitting device P2 form a second pixel unit, and the third color filter 613 and the corresponding third light-emitting device P3 form a third pixel unit. The first pixel unit, the second pixel unit and the third pixel unit may respectively emit red light, green light and blue light, and they may also be known as a red pixel unit, a green pixel unit and a blue pixel unit, so as to realize the full-color display of the display panel.

For any two adjacent pixel units, a color filter of one of the any two adjacent pixel units has a color different form a color of a color filter of another of the any two adjacent pixel units, and the color filter of one of the any two adjacent pixel units and the color filter of another of the any two adjacent pixel units have an overlapping portion, and an orthographic projection of the gap between the first electrode of the light-emitting device of one of the any two adjacent pixel units and the first electrode of the light-emitting device of another of the any two adjacent pixel units on the substrate falls within an orthographic projection of the overlapping portion on the substrate. In this way, the overlapping portion of the color filters of different colors is opaque to avoid light interference of two adjacent pixel units. With the partial overlap of the color filters of different colors, a black matrix between adjacent color filters in the related art may be omitted.

Specifically, the first pixel unit and the second pixel unit adjacent to the first pixel unit are illustrated by way of example for description. As shown in FIG. 4A and FIG. 4B, the first color filter 611 of the first pixel unit and the second color filter 612 of the second pixel unit 62 have an overlapping portion OP. Specifically, the first color filter 611 covers an edge of the second color filter 612 close to the first color filter 611. Since the first color filter 611 and the second color filter 612 are a red color filter and a green color filter, respectively, the overlapping portion OP of the first color filter 611 and the second color filter 612 of the second pixel unit is opaque, and the light interference of the adjacent first pixel unit and second pixel unit may be avoided. A gap T is between a first electrode 31' of the first light-emitting device P1 of the first pixel unit and a first electrode 31' of the second light-emitting device P2 of the second pixel unit. An orthographic projection of the gap T on the substrate 1 falls within an orthographic projection of the overlapping portion OP on the substrate 1.

In some embodiments, in a process of forming the color filter layer 6, the third color filter 613 is firstly formed, and then the second color filter 612 is formed, so that the second color filter 612 partially overlaps the third color filter 613 to form an overlapping portion between the second color filter 612 and the third color filter 613. Then the first color filter 611 is formed so that the first color filter 611 partially overlaps the second color filter 612 to form an overlapping portion between the first color filter 611 and the second color filter 612, and that the first color filter 611 further partially overlaps the third color filter 613 to form an overlapping portion between the first color filter 611 and the third color filter 613.

In some embodiments, as shown in FIG. 4A and FIG. 4B, the gap T is filled with the integral structure formed by the light-emitting functional portions 32' of the light-emitting devices P (that is, the light-emitting functional layer 32).

In some embodiments, as shown in FIG. 4A and FIG. 4B, in the display panel 10, the driving circuit layer 2 includes a planarization layer 20 close to the first electrode layer 31. The first electrode layer 3 is arranged on a side of the planarization layer 20 away from the substrate 1 and adjacent to the planarization layer 20. The display panel 10 may further include a pixel definition layer 9.

A surface of the planarization layer 20 facing away from the substrate 1 is provided with a plurality of separation grooves 201 to divide the planarization layer 20 into a plurality of driving regions 202, and the plurality of driving regions 202 are arranged in an array. An orthographic projection of each separation groove 201 on the substrate 1 falls within an orthographic projection of a corresponding gap T on the substrate 1.

Figure 5:
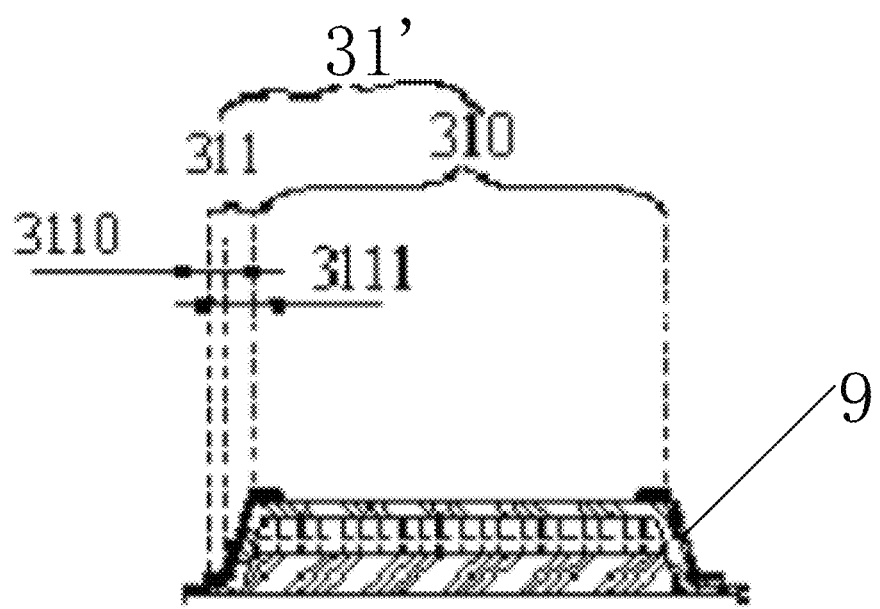
FIG. 5 shows an enlarged schematic diagram of a first electrode in FIG. 4A.

FIG. 5 shows an enlarged diagram of the first electrode 31' in FIG. 4A. As shown in FIG. 4A and FIG. 5, the first electrode layer 31 is provided on the surface of the planarization layer 20 away from the substrate 1, and includes a plurality of first electrodes 31' arranged in an array. Orthographic projections of the plurality of first electrodes 31' on the planarization layer 20 are located within the plurality of driving regions 202 in a one-to-one correspondence. The first electrode 31' includes a flat middle portion 310 and an edge portion 311 surrounding the middle portion 310. The edge portion 311 includes a flat portion 3110 surrounding the middle portion 310, and a slope portion 3111 connected between the middle portion 310 and the flat portion 3110. The flat portion 3110 has a thickness less than that of the middle portion 310.

The pixel definition layer 9 is arranged on a surface of the planarization layer 20 away from the substrate 1 and exposes at least a part of the middle portion 310. It may be understood that the pixel definition layer 9 covers the edge portion 311 of the first electrode 31'.

The light-emitting functional layer 32 covers the pixel definition layer 9, and the middle portion 310 of the first electrode 31' and the planarization layer 20 exposed by the pixel definition layer 9. The light-emitting functional layer 32 is filled in the separation groove 201. The second electrode layer 33 covers the entire surface of the light-emitting functional layer 32.

Since the orthographic projections of the plurality of first electrodes 31' on the planarization layer 20 are located within the plurality of driving regions 202 in a one-to-one correspondence, the orthographic projections of the plurality of first electrodes 31' on the planarization layer do not overlap the plurality of separation grooves 201. It may be understood that the orthographic projection of each separation groove 201 on the substrate 1 falls within the orthographic projection of the corresponding gap T on the substrate. In a process of forming the light-emitting functional layer 32, the light-emitting functional layer 32 may be recessed toward the substrate 1 at a position of each separation groove 201, so that a recess portion 331 is formed in the second electrode layer 33 at a position of a recess of the light-emitting functional layer 32. An orthographic projection of the recess portion 331 on the planarization layer 20 does not overlap the orthographic projection of the middle portion 310 of the first electrode 31' on the planarization layer 2. In this way, a position of the recess portion 331 in the second electrode layer 33 may be limited by the separation groove 201 so as to avoid a tip discharge or even a short circuit between the recess portion 331 and the middle portion 310 of the first electrode 31', which is beneficial to ensure the stable light emission of the light-emitting device. At the same time, light emission within the range of the recess portion 331 may be reduced or even avoided, thereby reducing the mutual interference of the light emission of adjacent light-emitting devices.

Hereinafter, each part of the display panel 10 in the embodiments of the present disclosure will be described in detail.

As shown in FIG. 4A, the substrate 1 may include a semiconductor material such as monocrystalline silicon or polycrystalline silicon, or other hard materials such as glass, or soft materials.

In some embodiments of the present disclosure, a plurality of driving transistors may be provided on the substrate 1 to drive respective light-emitting devices to emit light so as to display an image. Taking a driving transistor with a top gate structure as an example, the driving circuit layer 2 of the display panel 10 may further include a gate insulating layer GI, a gate electrode G, a first insulating layer 21 and a first wiring layer 22. The substrate 1 may include a semiconductor material such as monocrystalline silicon or polycrystalline silicon. The substrate 1 may include an active region 101, and a source electrode 1011 and a drain electrode 1012 located on both ends of the active region 101. The gate insulating layer GI covers the active region 101. The gate electrode G is arranged on a surface of the gate insulating layer GI away from the substrate 1, and the gate electrode G may include a polycrystalline material. The first insulating layer 21 covers the gate electrode G and the substrate 1, and the first insulating layer 21 may include at least one of silicon oxide and silicon nitride. The first wiring layer 22 is arranged on a surface of the first insulating layer 21 away from the substrate 1. Each of the gate electrode G, the source electrode 1011 and the drain electrode 1012 is connected to the first wiring layer 22 through via holes filled with tungsten or other metals.

In addition, the display panel 10 may further include a second insulating layer 23 and a second wiring layer 24. The second insulating layer 23 covers the first wiring layer 22 and the first insulating layer 21, and the second wiring layer 24 is provided on a surface of the second insulating layer 23 away from the substrate 1. A specific pattern of the second wiring layer 24 is not particularly limited here, and the second wiring layer 24 may be connected to the first wiring layer 22 through via holes filled with tungsten or other metals.

As shown in FIG. 4A, the planarization layer 20 is arranged on a side of the substrate 1. In some embodiments of the present disclosure, the planarization layer 20 may cover the second wiring layer 24, and the first electrode 31' may be connected to the second wiring layer 24 through via holes filled with tungsten or other metals. The planarization layer 20 may include at least one of silicon nitride and silicon oxide, and may further include other insulating materials. For example, the planarization layer 20 may be planarized by a polishing process.

The surface of the planarization layer 20 facing away from the substrate 1 may be provided with a plurality of separation grooves 201. A separation groove 201 may have a depth less than a thickness of the planarization layer 20, that is, the separation groove 201 does not penetrate the planarization layer 20 in a depth direction. The planarization layer 20 may be divided into a plurality of driving regions 202 by the plurality of separation grooves 201, and the plurality of driving regions 202 are arranged in an array.

An orthographic projection of a driving region 202 on the substrate 1 may be a rectangle, a pentagon, a hexagon or other polygons, and may also be a circle or other shapes, which is not specifically limited here. Furthermore, different driving regions 202 may have different shapes and dimensions.

Each separation groove 201 may include two opposite sidewalls 2011 and a bottom wall 2012 connected between the two sidewalls 2011. The two opposite sidewalls 2011 may be arranged in parallel, that is, the two opposite sidewalls 2011 as well as extension surfaces thereof do not intersect in a direction perpendicular to the substrate 1. Alternatively, the two opposite sidewalls 2011 may also be arranged at an angle.

In some embodiments, the bottom wall 2012 may be substantially parallel to the surface of the planarization layer 20 facing away from the substrate 1. Alternatively, as shown in FIG. 4A, the bottom wall 2012 may also be a curved surface that is convex in a direction away from the substrate 1. A curvature and a shape of the curved surface are not specifically limited here. In a cross-section perpendicular to the substrate 1, a contour of the bottom wall 2012 may be substantially arc-shaped, parabolic or wavy, and certainly may have other regular or irregular shapes, as long as it is convex in the direction away from the substrate 1.

In some embodiments of the present disclosure, the two opposite sidewalls 2011 may taper in a direction toward the bottom wall 2012. That is, a distance between the two opposite sidewalls 2011 gradually decreases in the direction toward the bottom wall 2012, so that a sidewall 2011 has a slope with respect to the surface of the planarization layer 20 away from the substrate, which slope is an angle between the sidewall 2011 and the surface of the planarization layer 20 away from the substrate 1. Further, the slope is not less than 70° and not greater than 90°, such as, the slope is 70°, 80°, 90°, and so on.

In some embodiments of the present disclosure, a distance between the two opposite sidewalls 2011 of the separation groove 201 may be within a range of 0.2 μm to 0.7 μm, such as 0.2 μm, 0.3 μm, 0.5 μm or 0.7 μm.

As shown in FIG. 1, the first electrode layer 31 is provided on the surface of the planarization layer 20 away from the substrate 1, and includes a plurality of first electrodes 31' arranged in an array. The orthographic projections of the plurality of first electrodes 31' on the planarization layer 20 are located within the plurality of driving regions 202 in a one-to-one correspondence. That is, a boundary of an orthographic projection of each first electrode 31' on the substrate 1 is located within a boundary of an orthographic projection of a corresponding driving region 202 on the substrate 1. Each driving region 202 corresponds to only one first electrode 31'. Since the driving region 202 is formed by separation of the separation groove 201, and the first electrode 31' is located on the driving region 202, the separation groove 201 is located outside the first electrode 31'. A shape of the orthographic projection of each first electrode 31' on the planarization layer 20 may be the same as that of a driving region 202 where the each first electrode 31' is located, and the boundary of the first electrode 31' is located within the driving region 202 where the first electrode 31' is located.

In a direction parallel to the substrate 1, at least one first electrode 31' may include a middle portion 310 and an edge portion 311 surrounding the middle portion 310. The middle portion 310 may be a flat structure, that is, the middle portion 310 is substantially parallel to the surface of the planarization layer 20 away from the substrate 1.

In some embodiments of the present disclosure, a boundary of the orthographic projection of the middle portion 310 of each first electrode 31' on the substrate 1 may be located within a boundary of an orthographic projection of a corresponding driving region 202 on the substrate 1, that is, there is a predetermined distance between the boundary of the orthographic projection of the middle portion 310 on the substrate 1 and the boundary of the orthographic projection of the corresponding driving region 202 on the substrate 1. For example, the predetermined distance is not less than 0.15 μm, such as the predetermined distance is 0.15 μm, 0.2 μm, 0.25 μm, or the like.

The edge portion 311 may include a flat portion 3110 and a slope portion 3111. The flat portion 3110 is located on the surface of the planarization layer 20 away from the substrate 1 and is arranged around the middle portion 310. The flat portion 3110 is substantially parallel to the surface of the planarization layer 20 away from the substrate 1. Further, the flat portion 3110 has a thickness less than that of the middle portion 310. In some embodiments of the present disclosure, there is a predetermined distance between a boundary of an orthographic projection of the flat portion 3110 on the substrate 1 and a boundary of a corresponding driving region 202 on the substrate 1. Optionally, the boundary of the orthographic projection of the flat portion 3110 on the substrate 1 overlaps the boundary of the orthographic projection of the corresponding driving region 202 on the substrate 1.

The slope portion 3111 is connected between the middle portion 310 and the flat portion 3110. That is, the slope portion 3111 is arranged around the middle portion 310, and the flat portion 3110 is arranged around the slope portion 3111. In some embodiments of the present disclosure, a slope of the slope portion 3111 with respect to the surface of the planarization layer 20 facing away from the substrate 1 is not less than 30°, and the slope is an angle between a surface of the slope portion 3111 and the surface of the planarization layer 20 facing away from the substrate 1.

The first electrode 31' includes a first conductive layer 320, a second conductive layer 321, and a third conductive layer 322. The first conductive layer 320 is provided on the surface of the planarization layer 20 away from the substrate 1. The second conductive layer 321 is provided on a surface of the first conductive layer 320 away from the substrate 1. The third conductive layer 322 is provided on a surface of the second conductive layer 321 away from the substrate 1 and extends to the planarization layer 20 with a slope to cover the first conductive layer 320 and the second conductive layer 321, so as to protect the first conductive layer 320 and the second conductive layer 321.

The middle portion 310 of the first electrode 31' includes the first conductive layer 320, the second conductive layer 321, and a region of the third conductive layer 322 located on the surface of the second conductive layer 321 away from the substrate 1. The edge portion 311 includes a region of the third conductive layer 322 covering the edge of the first conductive layer 320 and the edge of the second conductive layer 321, that is, a region extending toward the planarization layer 20. Exemplarily, the first conductive layer 320 may include titanium (Ti), the second conductive layer 321 may include silver (Ag), and the third conductive layer 322 may include indium tin oxide (ITO). And, other materials may also be used.

As shown in FIG. 1, the pixel definition layer 9 is made of an insulating material, and is arranged, together with the first electrode layer 31, on the surface of the planarization layer 20 away from the substrate 1. The pixel definition layer 9 covers the edge of the first electrode 31'. For example, the pixel definition layer 9 covers the edge portion 311 of the first electrode 31'. Further, the pixel definition layer 9 exposes at least a part of the middle portion 310 of the first electrode 31.

In some embodiments of the present disclosure, each first electrode 31' does not completely cover a corresponding driving region 202, and there is a distance between the boundary of the orthographic projection of the flat portion 3110 of the first electrode 31' on the substrate 1 and the boundary of the orthographic projection of the corresponding driving region 202 on the substrate 1. The pixel definition layer 9 extends to the sidewalls 2011 and the bottom wall 2012 of the separation groove 201, that is, the pixel definition layer 9 is conformally attached to the driving region 202 not covered by the first electrode 31', so that the pixel definition layer 9 is recessed at a position of an area of the corresponding separation groove 201. The pixel definition layer 9 is provided with a plurality of openings 901, each of the plurality of openings 901 exposes at least a part of each middle portion 310, so that a light-emitting range of the light-emitting device may be defined by the pixel definition layer 9. A dimension of the pixel unit may be indicated by a dimension of a corresponding opening 901.

Figure 6:
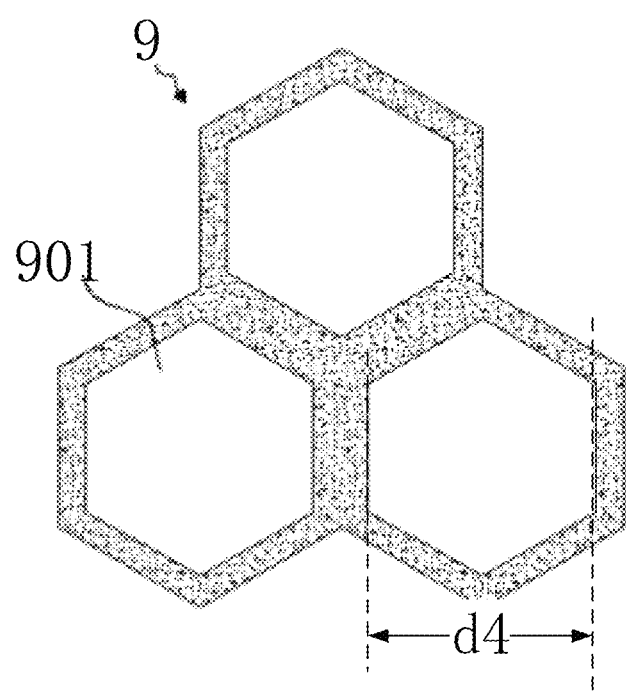
FIG. 6 shows a partial top view of a pixel definition layer according to some embodiments of the present disclosure.
Figure 7:
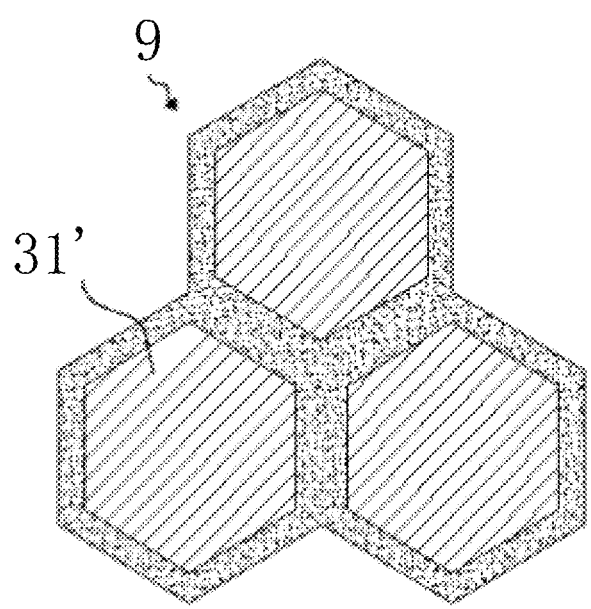
FIG. 7 shows a partial top view of a pixel definition layer and a first electrode layer according to some embodiments of the present disclosure.

FIG. 6 shows a partial top view of the pixel definition layer according to some embodiments of the present disclosure. FIG. 7 shows a partial top view of the pixel definition layer and the first electrode layer according to some embodiments of the present disclosure. As shown in FIG. 6 and FIG. 7, in some embodiments of the present disclosure, the opening 901 of the pixel definition layer 9 may be a hexagon or have other polygonal structure. The first electrode 31' may also have a polygonal structure, and have a shape similar to that of the opening 901. The first electrode 31' may also have other shapes. As shown in FIG. 6, the opening 901 may have a dimension d4 of about 4.6 μm to 5.2 μm, that is, a dimension of the pixel unit is with a range of about 4.6 μm to 5.2 μm.

As shown in FIG. 4A, the light-emitting functional layer 32 may be a continuous film layer, and at least partially covers the middle portion 310 of each first electrode 31', that is, covers the region exposed by the opening 901. The light-emitting functional layer 32 may further cover the pixel definition layer 9. When the light-emitting functional layer 32 is formed by evaporation or other processes, the light-emitting functional layer 32 is recessed in the direction toward the substrate 1 in the region of the corresponding separation groove 201.

In some embodiments of the present disclosure, the light-emitting functional layer 32 includes a hole injection layer, a hole transport layer, a light-emitting layer, an electron transport layer, and an electron injection layer that are sequentially stacked in a direction away from the substrate 1.

As shown in FIG. 4A, the second electrode layer 33 covers the light-emitting functional layer 32, and a driving signal may be applied to the first electrode 31' and the second electrode 33, so that a part of the light-emitting functional layer 32 located between the first electrode 31' and the second electrode layer 33 may emit light.

The morphology of the second electrode layer 33 matches that of the light-emitting functional layer 32. The second electrode layer 33 has a recess portion 331 formed at a recess of the light-emitting functional layer 32, and a smooth portion 332 formed in an area of the second electrode layer 33 corresponding to the middle portion 310 of the first electrode 31, so that an orthographic projection of the recess portion 331 on the planarization layer 20 does not overlap the orthographic projection of the middle portion 310 of the first electrode 31' on the planarization layer 20, so that the tip discharge between the first electrode 31' and the recess portion 331 of the second electrode layer 33 may be reduced or avoided. The second electrode layer 33 may include an alloy material. For example, the second electrode layer 33 may include Mg and Ag. Alternatively, the second electrode layer 33 may include an alloy of Al and Li. The second electrode layer 33 may also be made of other alloys or pure metals, which will not be listed here.

It should be noted that, in some embodiments, if the pixel definition layer 9 covers the edge of the middle portion 310 of the first electrode 31', the smooth portion 332 in an area of the second electrode layer 33 corresponding to a part of the pixel definition layer 9 covering the middle portion 310 may be convex in the direction away from the substrate 1. A height of the convex is less than the thickness of the first middle portion 310, so that the smooth portion 332 is substantially kept smooth.

Further, as shown in FIG. 4A, in some embodiments of the present disclosure, the recess portion 331 of the second electrode layer 32 has a lowest point on a cross-section perpendicular to the substrate 1, and an orthographic projection of the lowest point on the planarization layer 20 is completely located within the separation groove 201.

In some embodiments of the present disclosure, a maximum depth of the separation groove 201 is within a range of 1000 angstroms to 3000 angstroms.

In addition, in some embodiments of the present disclosure, as shown in FIG. 4A, the display panel 10 may further include a light extraction layer 11. The light extraction layer 11 covers a surface of the second electrode layer 33 away from the substrate 1 and is recessed in a region corresponding to the recess portion 331. The first thin film encapsulation layer 41 is provided on a side of the light extraction layer 11 away from the substrate 1. The light extraction layer 11 has a refractive index greater than that of the second electrode layer 33, which may improve the light extraction efficiency, and the higher the refractive index, the higher the light extraction efficiency.

Figure 8:
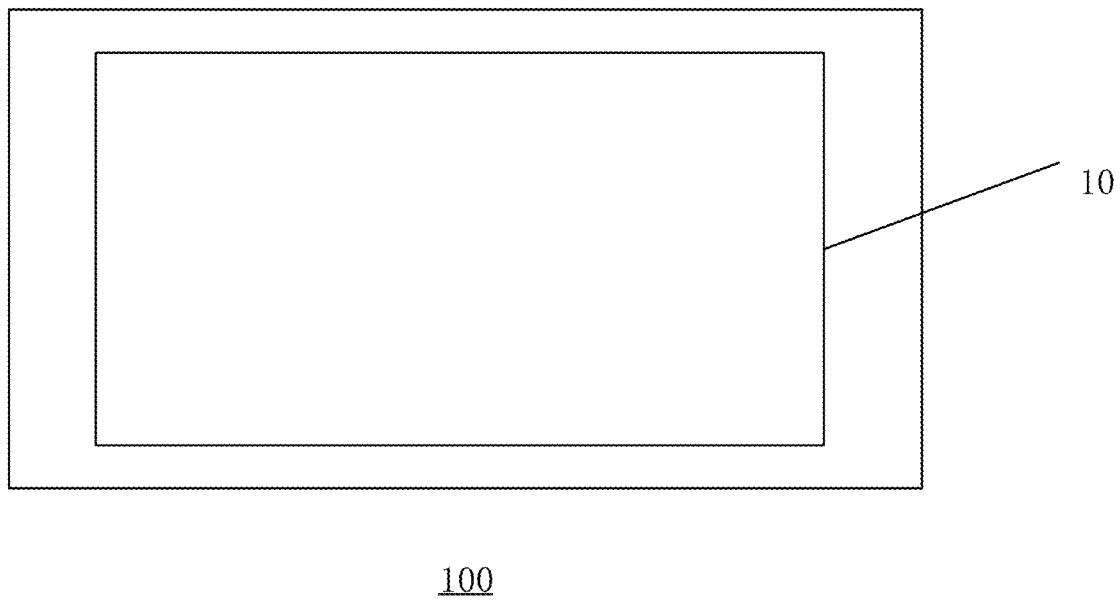
FIG. 8 shows a schematic diagram of a display device according to some embodiments of the present disclosure.

Some embodiments of the present disclosure further provide a display device. FIG. 8 shows a schematic diagram of a display device according to some embodiments of the present disclosure. As shown in FIG. 8, the display device 100 includes the display panel 10 described in the above embodiments, and the display panel may be, for example, an OLED display panel. The display device may be smart glasses, a projector, a television, a display, a digital photo frame, a mobile phone, a smart watch, a tablet computer, and other products or components with display functions.

Figure 9:
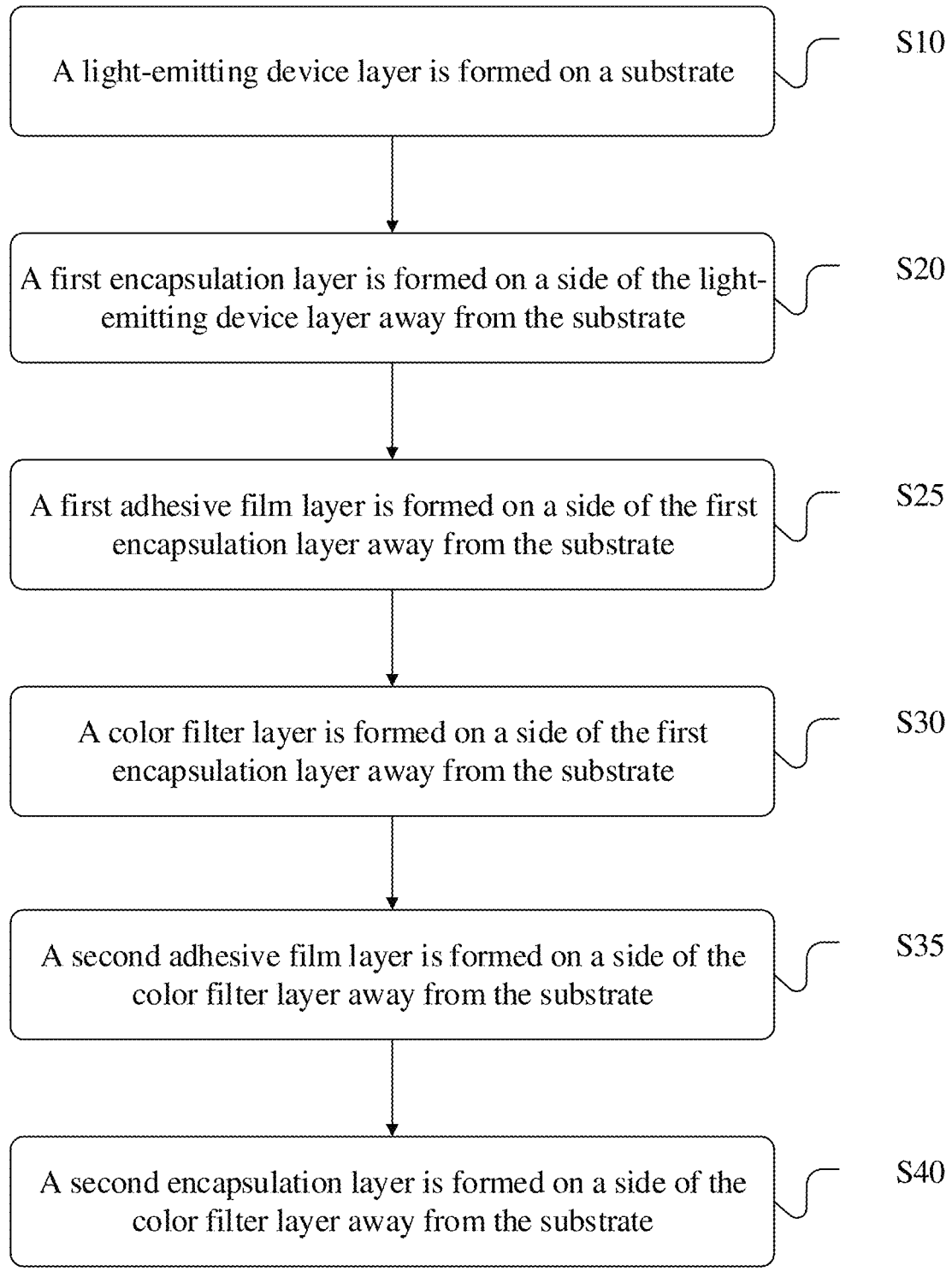
FIG. 9 shows a flowchart of a method of manufacturing a display device according to some embodiments of the present disclosure.

Some embodiments of the present disclosure further provide a method of manufacturing a display panel. FIG. 9 shows a flowchart of a method of manufacturing a display device according to some embodiments of the present disclosure. As shown in FIG. 9, the method of manufacturing the display panel includes following steps.

In step S10, a light-emitting device layer is formed on a substrate.

In step S20, a first thin film encapsulation layer is formed on a side of the light-emitting device layer away from the substrate.

In step S30, a color filter layer is formed on a side of the first thin film encapsulation layer away from the substrate.

In step S40, a second thin film encapsulation layer is formed on a side of the color filter layer away from the substrate.

The method may further include forming an adhesive film layer on at least one side of the color filter layer. The adhesive film layer and the color filter layer are in direct contact with each other and are stacked.

Specifically, the method further includes step S25 before forming the color filter layer on the side of the first thin film encapsulation layer away from the substrate.

In step S25, a first adhesive film layer is formed on a side of the first thin film encapsulation layer away from the substrate.

The method further includes step S35 before forming the second thin film encapsulation layer on the side of the color filter layer away from the substrate.

In step S35, a second adhesive film layer is formed on the side of the color filter layer away from the substrate.

In step S20, step S25, step S35 and step S40, the first thin film encapsulation layer, the first adhesive film layer, the second adhesive film layer and the second thin film encapsulation layer are all formed by an open mask process.

In the display device manufactured by using the above-mentioned method, the adhesive film layer (the first adhesive film layer and/or the second adhesive film layer) is provided between the color filter layer and the thin film encapsulation layer (the first thin film encapsulation layer and/or the second thin film encapsulation layer), which increases the adhesion between the color filter layer and the thin film encapsulation layer, so that the thin film encapsulation layer has stronger encapsulation performance. In addition, the adhesive film layer is arranged immediately adjacent to the color filter, so that the impurity particles on the upper and lower sides of the color filter introduced during the manufacturing process enter the adhesive film layer and are completely enclosed by the adhesive film layer. On the one hand, water and oxygen may not be separated out through these impurity particles, thereby avoiding the color filter being corroded by internal water and oxygen. On the other hand, the adhesive film layer is arranged between the color filter and the thin film encapsulation layer and has a predetermined thickness to prevent the thin film encapsulation layer from being punctured by impurity particles, thereby protecting the color filter layer from corrosion of external water and oxygen and ensuring a service life of the display panel.

The above descriptions are only preferred embodiments of the present disclosure and explanations of the technical principles applied. Those skilled in the art should understand that the scope of the invention involved in the present disclosure is not limited to the technical solutions formed by the specific combination of the above technical features, and should also cover other technical solutions formed by any combination of the above technical features or their equivalent features without departing from the inventive concept, for example, the technical features formed by mutual replacements of the above-mentioned features and the technical features with similar functions disclosed in the present disclosure (but not limited thereto).

What is claimed is:

1. A display panel, comprising:
   a substrate;
   a light-emitting device layer arranged on the substrate;
   a first thin film encapsulation layer arranged on a side of the light-emitting device layer away from the substrate, wherein the first thin film encapsulation layer comprises at least one organic layer;
   a color filter layer arranged on a side of the first thin film encapsulation layer away from the substrate;
   a second thin film encapsulation layer arranged on a side of the color filter layer away from the substrate, wherein the second thin film encapsulation layer comprises at least one organic layer; and
   an adhesive film layer arranged on at least one side of the color filter layer, wherein the adhesive film layer is in direct contact with the color filter layer, and the adhesive film layer and the color filter layer are stacked, and a material of the adhesive film layer has a viscosity greater than a viscosity of a material of the organic layer in each of the first thin film encapsulation layer and the second thin film encapsulation layer.

2. The display panel of claim 1, wherein the adhesive film layer is in direct contact with the organic layer in at least one of the first thin film encapsulation layer and the second thin film encapsulation layer.

3. The display panel of claim 1, wherein the adhesive film layer comprises:
   a first adhesive film layer arranged between the first thin film encapsulation layer and the color filter layer; and
   a second adhesive film layer arranged between the color filter layer and the second thin film encapsulation layer.

4. The display panel of claim 3, wherein an orthographic projection of the color filter layer on the substrate falls within at least one of an orthographic projection of the first adhesive film layer on the substrate and an orthographic projection of the second adhesive film layer on the substrate.

5. The display panel of claim 3, wherein,
   an orthographic projection of the color filter layer on the substrate falls within an orthographic projection of the first thin film encapsulation layer on the substrate;
   the orthographic projection of the first thin film encapsulation layer on the substrate falls within an orthographic projection of the first adhesive film layer on the substrate;
   the orthographic projection of the first adhesive film layer on the substrate falls within an orthographic projection of the second adhesive film layer on the substrate; and
   the orthographic projection of the second adhesive film layer on the substrate falls within an orthographic projection of the second thin film encapsulation layer on the substrate.

6. The display panel of claim 5, wherein an area of the orthographic projection of the color filter layer on the substrate, an area of the orthographic projection of the first thin film encapsulation layer on the substrate, an area of the orthographic projection of the first adhesive film layer on the substrate, an area of the orthographic projection of the second adhesive film layer on the substrate and an area of the orthographic projection of the second thin film encapsulation layer on the substrate increases in sequence.

7. The display panel of claim 5, wherein the display panel comprises a display area and a peripheral area surrounding the display area, and the orthographic projection of the color filter layer on the substrate falls within the display area, and each of an edge of the first thin film encapsulation layer, an edge of the first adhesive film layer, an edge of the second adhesive film layer and an edge of the second thin film encapsulation layer is located in the peripheral area.

8. The display panel of claim 7, wherein in a direction from the display area to the peripheral area, the edge of the first film encapsulation layer, the edge of the first adhesive film layer, the edge of the second adhesive film layer and the edge of the second thin film encapsulation layer are arranged sequentially away from the display area and are spaced apart from each other.

9. The display panel of claim 8, wherein,
   a distance between the edge of the first thin film encapsulation layer and the edge of the first adhesive film layer is greater than four times a dimension of a pixel unit of the display panel;
   a distance between the edge of the first adhesive film layer and the edge of the second adhesive film layer is greater than four times the dimension of the pixel unit of the display panel; and
   a distance between the edge of the second adhesive film layer and the edge of the second thin film encapsulation layer is greater than four times the dimension of the pixel unit of the display panel.

10. The display panel of claim 1, wherein the adhesive film layer comprises an organic material comprising at least one of 1-methoxy-2-propanol, propylene glycol monomethyl ether ester, multifunctional group of acrylic monomers, oxime derivative, and acrylic resin derivative.

11. The display panel of claim 3, wherein a thickness of the first adhesive film layer is less than a thickness of the second adhesive film layer.

12. The display panel of claim 11, wherein the thickness of the second adhesive film layer is about three times that of the first adhesive film layer.

13. The display panel of claim 3, wherein the first thin film encapsulation layer comprises a first sub-layer, a second sub-layer and a third sub-layer that are arranged sequentially away from the substrate and that are stacked, and
   wherein the first sub-layer comprises silicon nitride, the second sub-layer comprises aluminum oxide, the third sub-layer comprises parylene, and the first adhesive film layer is in direct contact with the third sub-layer,
   wherein a thickness of the first adhesive film layer is greater than half of a thickness of the third sub-layer.

14. The display panel of claim 3, wherein the second thin film encapsulation layer comprises a fourth sub-layer and a fifth sub-layer that are arranged sequentially away from the substrate and that are stacked, and
   wherein the fourth sub-layer comprises parylene, the fifth sub-layer comprises silicon oxide, and the second adhesive film layer is in direct contact with the fourth sub-layer.

15. The display panel of claim 1, wherein the light-emitting device layer comprises a plurality of light-emitting devices arranged in an array, and each of the plurality of light-emitting devices comprises a first electrode, a light-emitting functional portion and a second electrode that are arranged sequentially away from the substrate,
   wherein for any two adjacent light-emitting devices among the plurality of light-emitting devices, the first electrode of one of the any two adjacent light-emitting devices is spaced apart from the first electrode of another of the any two adjacent light-emitting devices, light-emitting functional portions of the any two adjacent light-emitting devices are formed as an integral structure, and second electrodes of the any two adjacent light-emitting devices are formed as an integral structure, and wherein the color filter layer comprises a plurality of color filters corresponding to the plurality of light-emitting devices one-to-one, and an orthographic projection of a first electrode of each of the plurality of light-emitting devices on the substrate falls within an orthographic projection of the color filter corresponding to the each of the plurality of light-emitting devices on the substrate.

16. The display panel of claim 15, wherein the plurality of light-emitting devices comprises a first light-emitting device and a second light-emitting device that are adjacent to each other, and a gap is formed between the first electrode of the first light-emitting device and the first electrode of the second light-emitting device, wherein the color filter layer comprises a first color filter and a second color filter, and the first color filter has a color different from a color of the second color filter, the first color filter corresponds to the first light-emitting device, the second color filter corresponds to the second light-emitting device, and the first color filter and the second color filter have an overlapping portion, and wherein an orthographic projection of the gap on the substrate falls within an orthographic projection of the overlapping portion on the substrate, wherein the gap is filled with an integral structure comprising a light-emitting functional portion of the first light-emitting device and a light-emitting functional portion of the second light-emitting device.

17. The display panel of claim 1, wherein the substrate is a silicon substrate, and the display panel is a silicon-based display panel.

18. A display device comprising the display panel of claim 1.

19. A method of manufacturing a display panel, comprising:

forming a light-emitting device layer on a substrate;

forming a first thin film encapsulation layer on a side of the light-emitting device layer away from the substrate, wherein the first thin film encapsulation layer comprises at least one organic layer;

forming a color filter layer on a side of the first thin film encapsulation layer away from the substrate;

forming a second thin film encapsulation layer on a side of the color filter layer away from the substrate, wherein the second thin film encapsulation layer comprises at least one organic layer; and forming an adhesive film layer on at least one side of the color filter layer, wherein the adhesive film layer is in direct contact with the color filter layer, and the adhesive film layer and the color filter layer are stacked, and a viscosity of a material of the adhesive film layer is greater than a viscosity of a material of the organic layer in each of the first thin film encapsulation layer and the second thin film encapsulation layer.

20. The method of claim 19, further comprising:

forming a first adhesive film layer on the side of the first thin film encapsulation layer away from the substrate before forming the color filter layer on the side of the first thin film encapsulation layer away from the substrate; and forming a second adhesive film layer on the side of the color filter layer away from the substrate before forming the second thin film encapsulation layer on the side of the color filter layer away from the substrate.

* * * * *